(12) United States Patent
Kim et al.

(10) Patent No.: US 6,680,964 B2
(45) Date of Patent: Jan. 20, 2004

(54) MOISTURE PASSIVATED PLANAR INDEX-GUIDED VCSEL

(75) Inventors: Seongsin Kim, San Jose, CA (US); Wilson H. Widjaja, Cupertino, CA (US); Suning Xie, Santa Clara, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 136 days.

(21) Appl. No.: 10/013,108

(22) Filed: Dec. 7, 2001

(65) Prior Publication Data

US 2003/0108075 A1 Jun. 12, 2003

(51) Int. Cl.$^7$ .............................................. H01S 5/183
(52) U.S. Cl. ....................................................... 372/96
(58) Field of Search ........................................... 372/96

(56) References Cited

U.S. PATENT DOCUMENTS

| | | |
|---|---|---|
| 5,719,893 A | 2/1998 | Jiang et al. |
| 5,851,849 A | 12/1998 | Comizzoli et al. |
| 5,896,408 A | 4/1999 | Corzine et al. |
| 5,978,408 A | 11/1999 | Thornton |
| 6,208,681 B1 | 3/2001 | Thornton |
| 6,269,109 B1 * | 7/2001 | Jewell ........................ 372/43 |

* cited by examiner

Primary Examiner—James Davie

(57) ABSTRACT

Systems and methods of passivating planar index-guided oxide vertical cavity surface emitting lasers (VCSELs) are described. These systems and methods address the unique susceptibility of these devices to damage that otherwise might be caused by moisture intrusion into the etch holes that are used to form the index-guiding confinement regions. In one aspect, a VCSEL includes a vertical stack structure having a substantially planar top surface. The vertical stack structure includes a top mirror, a bottom mirror, and a cavity region disposed between the top mirror and the bottom mirror and including an active light generation region. At least one of the top mirror and the bottom mirror has a layer with a peripheral region that is oxidized into an electrical insulator as a result of exposure to an oxidizing agent. The vertical stack structure defines two or more etched holes each extending from the substantially planar top surface to the oxidized peripheral region. Each of the etched holes is moisture passivated by an overlying moisture penetration barrier.

11 Claims, 4 Drawing Sheets

MOISTURE PASSIVATED PLANAR INDEX-GUIDED VCSEL

TECHNICAL FIELD

This invention relates to planar index-guided oxide vertical cavity surface emitting lasers (VCSELs) and methods of making the same.

BACKGROUND

A VCSEL is a laser device formed from an optically active semiconductor layer (e.g., AlInGaAs or InGaAsP) that is sandwiched between a pair of highly reflective mirror stacks, which may be formed from layers of metallic material, dielectric material or epitaxially-grown semiconductor material. Typically, one of the mirror stacks is made less reflective than the other so that a portion of the coherent light that builds in a resonating cavity formed in the optically active semiconductor layer between the mirror stacks may be emitted from the crevice. Typically, a VCSEL emits laser light from the top or bottom surface of the resonating cavity with a relatively small beam divergence. VCSELs may be arranged in singlets, one-dimensional or two-dimensional arrays, tested on wafer, and incorporated easily into an optical transceiver module that may be coupled to a fiber optic cable.

In general, a VCSEL may be characterized as a gain-guided VCSEL or an index-guided VCSEL. An implant VCSEL is the most common commercially available gain-guided VCSEL. An implant VCSEL includes one or more high resistance implant regions for current confinement and parasitic reduction. An oxide VCSEL, on the other hand, is the most common laterally index-guided VCSEL. An oxide VCSEL includes oxide layers (and possibly implant regions) for both current and optical confinement.

VCSELs and VCSEL arrays have been successfully developed for single-mode operation and multi-mode operation at a variety of different wavelengths (e.g., 650 nm, 850 nm, 980 nm, 1300 nm and 1550 nm). The commercial success of VCSEL technology, however, will depend in large part upon development of VCSEL structures that are characterized by high performance and high reliability.

Techniques have been proposed for improving the performance and reliability of VCSELs. For example, U.S. Pat. No. 5,719,893 describes a scheme for passivating ridge and implant VCSELs against physical and chemical damage. In accordance with this scheme, a layer of insulating material covers the entire VCSEL structure, including the light-emitting aperture region and the surrounding top metal electrode. The insulating material has an optical thickness that is an integral multiple of one half of the wavelength of light that the VCSELs are designed to emit. The passivating layer covers the entire VCSEL device structure in order to protect the device from physical and chemical damage.

SUMMARY

The invention features a scheme (systems and methods) of passivating planar index-guided VCSELs that addresses the unique susceptibility of these devices to damage that otherwise might be caused by moisture intrusion into the etch holes that are used to form the index-guiding confinement regions.

In one aspect, the invention features a VCSEL that includes a vertical stack structure having a substantially planar top surface. The vertical stack structure includes a top mirror, a bottom mirror, and a cavity region disposed between the top mirror and the bottom mirror and includes an active light generation region. At least one of the top mirror and the bottom mirror has a layer with a peripheral region that is oxidized into an electrical insulator as a result of exposure to an oxidizing agent. The vertical stack structure defines two or more etched holes each extending from the substantially planar top surface to the oxidized peripheral region. Each of the etched holes is moisture passivated by an overlying moisture penetration barrier.

Embodiments of the invention may include one or more of the following features.

The moisture penetration barrier preferably has a thickness that is selected to prevent substantial vertical moisture intrusion into the etched holes. In some embodiments, the moisture penetration barrier comprises a silicon nitride layer having a thickness of approximately 300 nm or greater.

Each of the etched holes preferably is moisture passivated by an overlying moisture penetration barrier having a lateral surface area that is sufficient to prevent substantial delamination of the moisture penetration barrier.

Multiple etched holes may be moisture passivated by a single continuous film of moisture penetration barrier material.

The VCSEL may include a top electrode that is disposed over the substantially planar top surface of the vertical stack structure and circumscribes a light emission region that is substantially free of any overlying moisture penetration barrier material. In some embodiments, the moisture penetration barrier covers a major portion of the top surface of the vertical stack structure other than the top electrode and the light emission region.

In some embodiments, the moisture penetration barrier includes a peripheral edge that intersects the top surface of the vertical stack structure at a moisture penetration interface. At the top surface of the vertical stack structure each of the etched holes may be circumscribed by a respective peripheral edge having a substantial portion that is separated from the moisture penetration interface by a distance that is sufficient to prevent substantial lateral moisture intrusion into the etched holes. For example, in some embodiments, a substantial portion of each of the etched hole peripheral edges may be separated from the moisture penetration interface by a distance of approximately 15 µm or greater.

In another aspect, the invention features an array of two or more of the above-described VCSELs.

In another aspect, the invention features a method of manufacturing the above-described VCSEL.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1A:
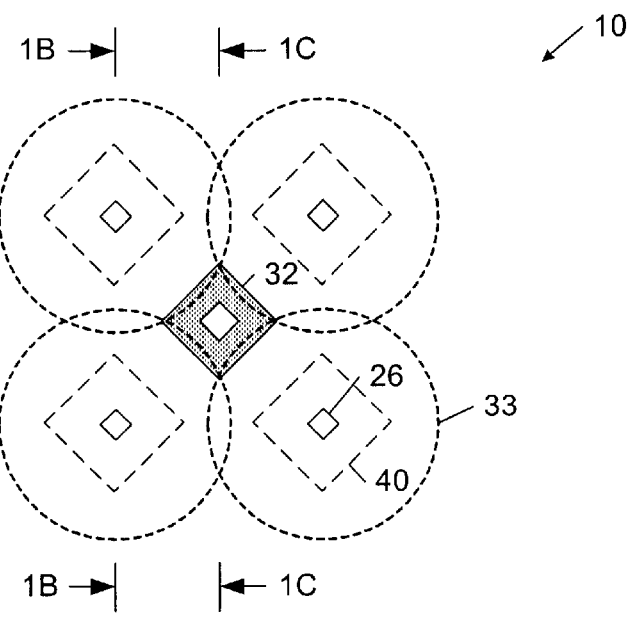
FIG. 1A diagrammatic top view of a planar VCSEL with four etched holes moisture passivated by an overlying moisture penetration barrier.
Figure 1B:
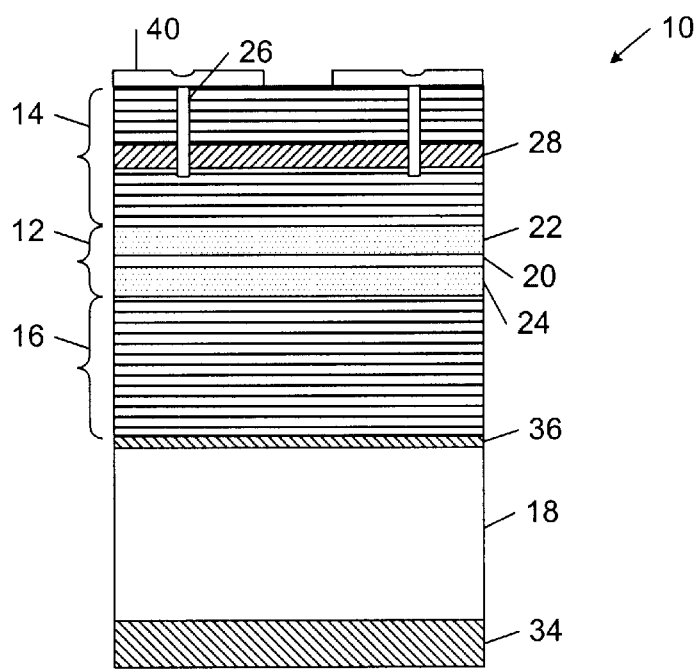
FIG. 1B is a diagrammatic cross-sectional side view of the planar VCSEL of FIG. 1A taken along the line 1B—1B.
Figure 1C:
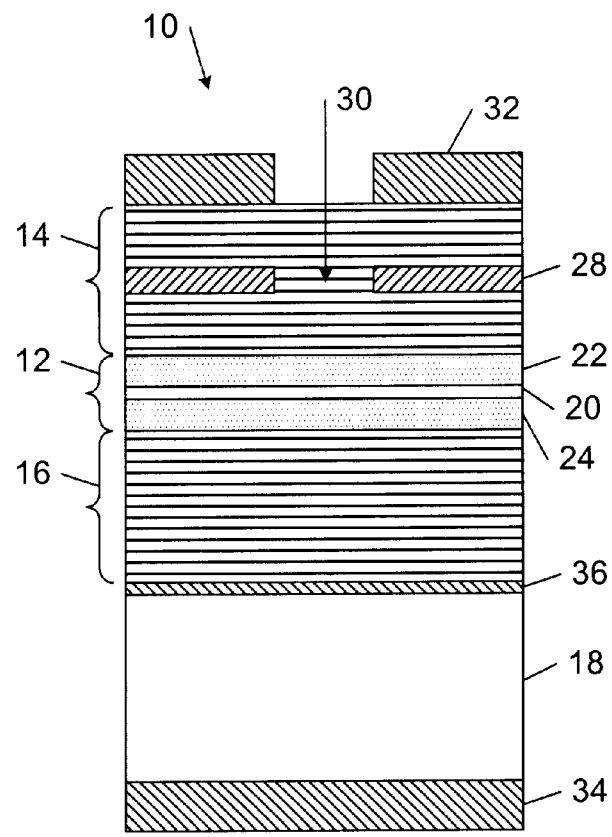
FIG. 1C is a diagrammatic cross-sectional side view of the planar VCSEL of FIG. 1A taken along the line 1C—1C.

Referring to FIGS. 1A, 1B and 1C, in one embodiment, a planar index-guided VCSEL 10 includes a cavity region 12 sandwiched between a first mirror stack 14 and a second mirror stack 16, which is formed on a substrate 18. Cavity region 12 includes one or more active layers 20 (e.g., a quantum well or one or more quantum dots) that are sandwiched between a pair of spacer layers 22, 24. In other embodiments, active layer 20 may be located above or below a single spacer layer. As shown, in this embodiment, VCSEL 10 has a planar structure that includes a number of holes 26 that expose a number of respective side regions of first mirror stack 14 to be oxidized. At least a portion 28 of first mirror stack 14 is oxidized from the exposed side regions inwardly toward a centrally located aperture region 30. In this embodiment, four holes 26 are opened at locations that are equidistant from the center of a first electrical contact 32. Holes 26 extend from the top surface of first mirror stack 14 down at least to the layer (or layers) corresponding to oxidized portion 28. When the VCSEL structure is exposed to heated water vapor, the heated water vapor enters holes 26 and oxidizes portion 28 in a radial direction away from holes 26. The oxidation process continues until the oxidation front 33 from each hole 26 merges to form the un-oxidized aperture region 30. Other VCSEL embodiments may include more or fewer exposure holes 26 or exposed regions with other shapes, such as divided arcs or rings.

Electrical contact 32 together with a second electrical contact 34, which is located at the opposite end of the device, enable VCSEL 10 to be driven by a suitable driving circuit. In operation, an operating voltage is applied across electrical contacts 32, 34 to produce a current flow in VCSEL 10. In general, current flows through a central region of the VCSEL structure and lasing occurs in a central portion of cavity region 12 (hereinafter the "active region"). The oxidized portion 28 of first mirror stack 14 forms an oxide confinement region that laterally confines carriers and photons. Carrier confinement results from the relatively high electrical resistivity of the confinement region, which causes electrical current preferentially to flow through a centrally located region of VCSEL 10. Optical confinement results from a substantial reduction of the refractive index of the confinement region that creates a lateral refractive index profile that guides the photons that are generated in cavity region 12. The carrier and optical lateral confinement increases the density of carriers and photons within the active region and, consequently, increases the efficiency with which light is generated within the active region.

Active layer 20 may be formed from AlInGaAs (i.e., AlInGaAs, GaAs, AlGaAs and InGaAs), InGaAsP (i.e., InGaAsP, GaAs, InGaAs, GaAsP, and GaP), GaAsSb (i.e., GaAsSb, GaAs, and GaSb), InGaAsN (i.e., InGaAsN, GaAs, InGaAs, GaAsN, and GaN), or AlInGaAsP (i.e., AlInGaAsP, AlInGaAs, AlGaAs, InGaAs, InGaAsP, GaAs, InGaAs, GaAsP, and GaP). Other quantum well layer compositions also may be used. First and second spacer layers 22, 24 may be formed from materials chosen based upon the material composition of the active layers. First and second mirror stacks 14, 16 each includes a system of alternating layers of different refractive index materials that forms a distributed Bragg reflector (DBR) designed for a desired operating laser wavelength (e.g., a wavelength in the range of 650 nm to 1650 nm). For example, first and second mirror stacks 14, 16 may be formed of alternating layers of high aluminum content AlGaAs and low aluminum content AlGaAs. The layers of first and second mirror stacks 14, 16 preferably have an effective optical thickness (i.e., the layer thickness multiplied by the refractive index of the layer) that is about one-quarter of the operating laser wavelength. Substrate 18 may be formed from GaAs, InP, sapphire ($Al_2O_3$), or InGaAs and may be undoped, doped n-type (e.g., with Si) or doped p-type (e.g., with Zn). A buffer layer 36 may be grown on substrate 18 before VCSEL 10 is formed. In the illustrative representation of FIG. 1, first and second mirror stacks 14, 16 are designed so that laser light is emitted from the top surface of VCSEL 10. In other embodiments, the mirror stacks 14, 16 may be designed so that laser light is emitted from the bottom surface of substrate 18.

VCSEL 10 may be formed by conventional epitaxial growth processes, such as metal-organic chemical vapor deposition (MOCVD) and molecular beam epitaxy (MBE).

Figure 2:
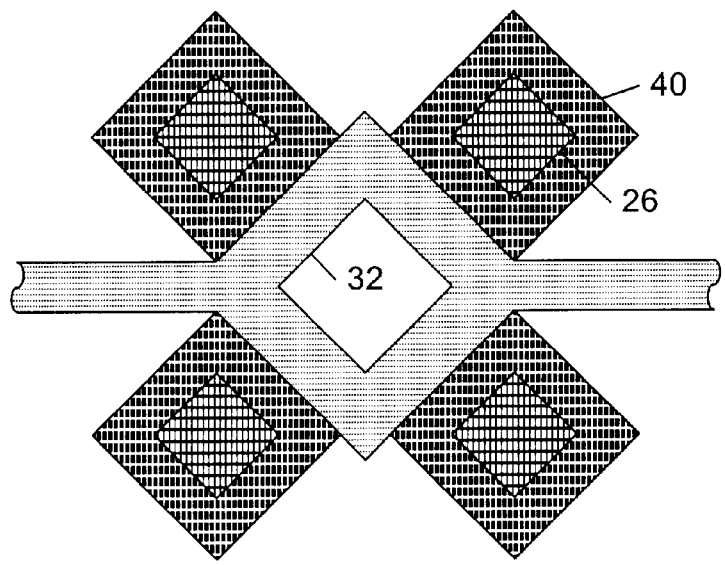
FIG. 2 is a diagrammatic top view of a planar VCSEL with four etched holes moisture passivated by an overlying patterned moisture penetration barrier.

As shown in FIGS. 1A, 1B and 2, VCSEL 10 includes a moisture penetration barrier 40 that overlies and passivates each of the etched holes 26. Moisture penetration barrier 40 addresses the unique susceptibility of these devices to damage that otherwise might be caused by moisture intrusion into the etch holes 26. In particular, it has been observed that unpassivated and non-hermetically sealed planar index-guided VCSELs are subject to a high rate of catastrophic failure in humid environments. Under high-humidity conditions, the lifetime of such VCSEL devices may be limited to on the order of a few hundred hours, which is substantially less than the $10^5$ hour lifetimes that are observed for similar VCSEL devices under standard high-temperature, harsh aging conditions. In the illustrated embodiment, moisture penetration barrier 40 corresponds to a thin film layer that is patterned into a set of four rectangular patches. Each patch extends over a respective etched hole 26 to reduce moisture intrusion into the etched holes 26 and, thereby, substantially delay or effectively prevent moisture-related damage to VCSEL 10. Moisture penetration barrier 40 may be formed from any electrically insulating and moisture-resistant material that is compatible with the process technology used to fabricate VCSEL 10, including a nitride material (e.g., silicon nitride), an oxynitride material (e.g., silicon oxynitride), and an oxide material (e.g., silicon dioxide).

Figure 3:
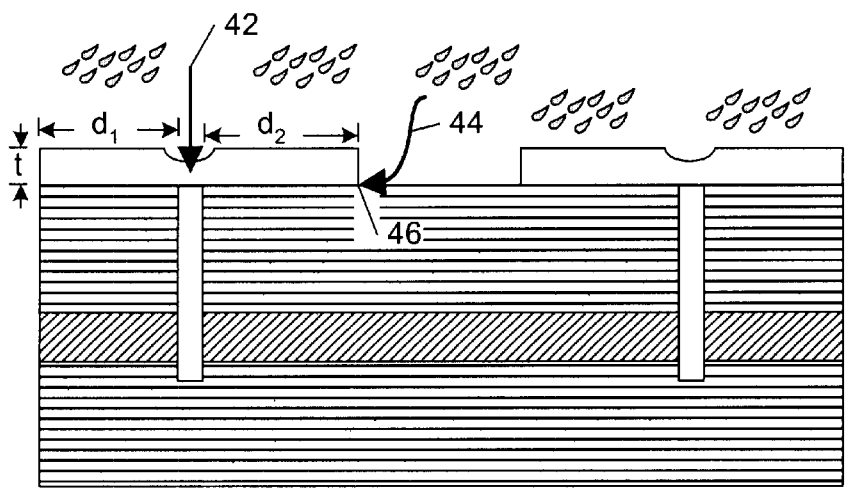
FIG. 3 is a diagrammatic cross-sectional side view of a top surface region of the planar VCSEL exposed to a moisture environment.
Figure 4:
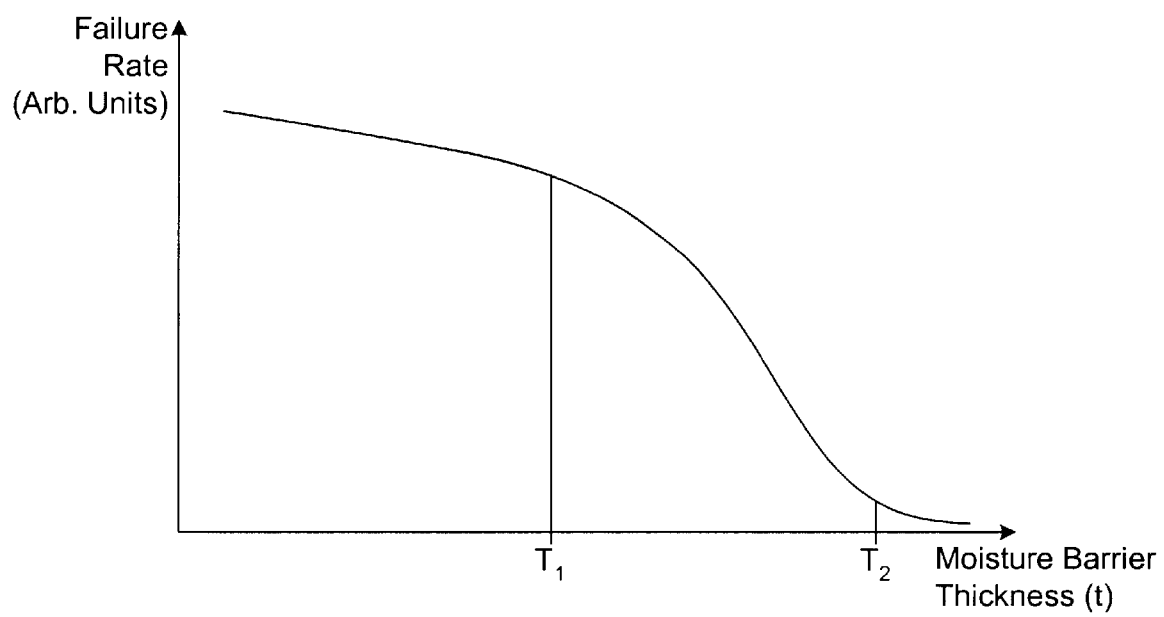
FIG. 4 is a conceptual graph of VCSEL failure rate plotted as a function of moisture penetration barrier thickness.
Figure 5:
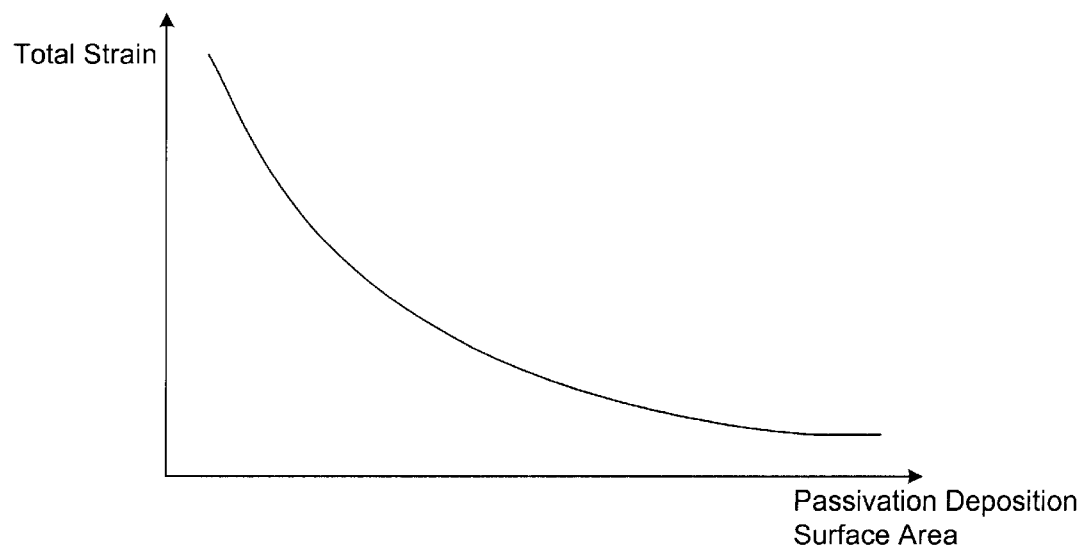
FIG. 5 is a conceptual graph of passivation layer total film strain plotted as a function of moisture penetration barrier surface area.

Referring to FIGS. 3, 4 and 5, in general, moisture penetration barrier 40 should have a thickness (t) that is sufficient to prevent substantial vertical moisture intrusion 42 into the etched holes 26. As shown in the conceptual graph of FIG. 4, the VCSEL failure rate in high humidity environments has been observed to decrease dramatically with passivation layer thickness after the passivation layer thickness reaches a first threshold ($T_1$). Beyond a second threshold ($T_2$), however, the decrease in failure rate is substantially less pronounced. In one embodiment, moisture penetration barrier 40 is formed from silicon nitride deposited in accordance with a conventional low stress silicon nitride deposition process. In this embodiment, the first threshold thickness ($T_1$) is approximately 300 nm and the second threshold thickness ($T_2$) is approximately 500 nm. In other embodiments, the actual values for the threshold thicknesses $T_1$ and $T_2$ will depend upon a number of factors, including the material properties of moisture penetration barrier.

In addition to having a sufficient film thickness, moisture penetration barrier 40 should extend laterally beyond the edges of the etched holes 26 by a distance ($d_1$, $d_2$) that is sufficient to prevent substantial lateral moisture intrusion into the etched holes 26. Lateral moisture intrusion may result from leakage along a path extending from the etched holes to a moisture penetration interface 46, which is formed at the intersection of the top surface of first mirror stack 14 and the peripheral edges of moisture penetration barrier 40. In embodiments having a silicon nitride moisture penetration barrier, the separation distances ($d_1$, $d_2$) between the peripheral edges of the moisture penetration barrier and the peripheral edges of the etched holes at the top surface of first mirror stack 14 preferably is on the order of approximately 15 μm or greater. Of course the separation distance between the peripheral edge of the moisture penetration barrier and the peripheral edges of the etched holes may be constrained in one or more directions depending upon other device structures on the top surface of first mirror stack 14. For example, in some embodiments, the light emission region is substantially free of any overlying moisture penetration barrier material, in which case the separation distance cannot exceed the separation distance between the etched holes and the light emission region.

Figure 6:
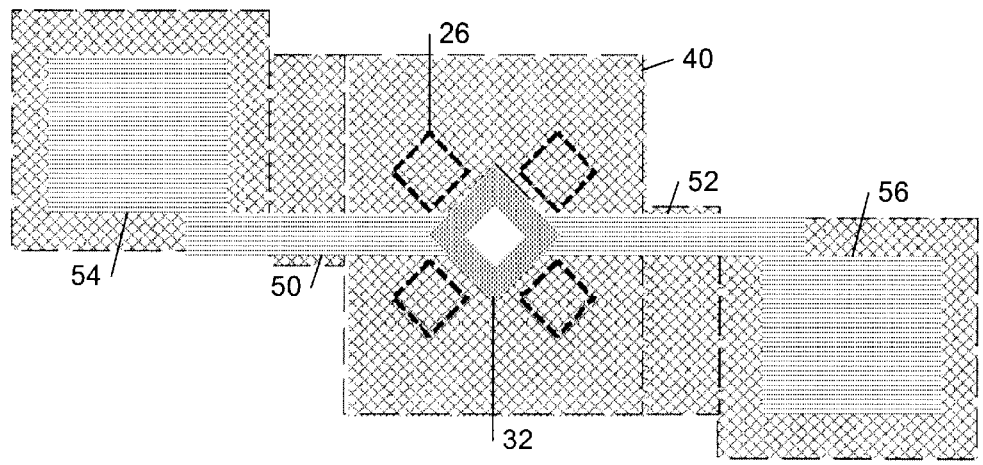
FIG. 6 is a diagrammatic top view of a planar VCSEL with four etched holes moisture passivated by an overlying moisture penetration barrier.

Referring to FIGS. 5 and 6, in some embodiments, lateral moisture intrusion may result primarily from delamination of the moisture penetration barrier 40 from the top surface of first mirror stack 14. As shown in the conceptual graph of FIG. 5, total film strain of moisture penetration barrier 40—which correlates with the probability that the moisture penetration barrier 40 will delaminate from the top surface of first mirror stack 14—decreases exponentially with surface area. Thus, to reduce lateral moisture intrusion into etched holes 26, moisture penetration barrier 40 should be patterned into patches each having a lateral surface area that is sufficient to reduce the film stress per unit area to a level that avoids substantial delamination of the moisture penetration barrier. As shown in FIG. 6, in some embodiments, moisture penetration barrier 40 may be formed as a single continuous film of material that overlies a substantial portion of the top surface of first mirror stack 14, including each of the etched holes 26. In these embodiments, moisture penetration barrier 40 has an area that is sufficient to avoid substantial delamination of the moisture penetration barrier 40 and, thereby, substantially reduces lateral moisture intrusion into etched holes 26. In general, moisture penetration barrier 40 may extend over as much of the top surface of the first mirror stack 14 as is available. In the embodiments of FIG. 6, metal lines 50, 52 may extend over moisture penetration barrier 40 from electrode 32 to bonding pads 54, 56, which also are disposed over moisture penetration barrier 40.

VCSEL devices having a silicon nitride moisture penetration barrier 40 with the surface layout shown in FIG. 6 and a thickness of 500 nm have been demonstrated to have lifetimes that are ten times longer than the lifetimes of non-passivated devices in humid environments.

Other embodiments are within the scope of the claims. For example, although the above embodiments are described in connection with AlGaAs mirror stack systems, other semiconductor alloy compositions or dielectric layers may be used to form the DBR mirror structures.

What is claimed is:

1. A vertical cavity surface emitting laser (VCSEL), comprising:
    a vertical stack structure having a substantially planar top surface, including
        a top mirror,
        a bottom mirror,
        a cavity region disposed between the top mirror and the bottom mirror and including an active light generation region,
        at least one of the top mirror and the bottom mirror having a layer with a peripheral region oxidized into an electrical insulator as a result of exposure to an oxidizing agent;
    wherein the vertical stack structure defines two or more etched holes each extending from the substantially planar top surface to the oxidized peripheral region, each of the etched holes being moisture passivated by an overlying moisture penetration barrier.

2. The VCSEL of claim 1, wherein the moisture penetration barrier has a thickness selected to prevent substantial vertical moisture intrusion into the etched holes.

3. The VCSEL of claim 2, wherein the moisture penetration barrier comprises a silicon nitride layer having a thickness of approximately 300 nm or greater.

4. The VCSEL of claim 3, wherein the moisture penetration barrier comprises a silicon nitride layer having a thickness of approximately 500 nm or greater.

5. The VCSEL of claim 1, wherein each of the etched holes is moisture passivated by an overlying moisture penetration barrier having a lateral surface area sufficient to prevent substantial delamination of the moisture penetration barrier.

6. The VCSEL of claim 1, wherein multiple etched holes are moisture passivated by a single continuous film of moisture penetration barrier material.

7. The VCSEL of claim 1, further comprising a top electrode disposed over the substantially planar top surface of the vertical stack structure and circumscribing a light emission region substantially free of any overlying moisture penetration barrier material.

8. The VCSEL of claim 7, wherein the moisture penetration barrier covers a major portion of the top surface of the vertical stack structure other than the top electrode and the light emission region.

9. The VCSEL of claim 1, wherein:
    the moisture penetration barrier includes a peripheral edge intersecting the top surface of the vertical stack structure at a moisture penetration interface; and
    at the top surface of the vertical stack structure each of the etched holes is circumscribed by a respective peripheral edge having a substantial portion separated from the moisture penetration interface by a distance sufficient to prevent substantial lateral moisture intrusion into the etched holes.

10. The VCSEL of claim 9, wherein a substantial portion of each of the etched hole peripheral edges is separated from the moisture penetration interface by a distance of approximately 15 μm or greater.

11. An array of two or more vertical cavity surface emitting lasers (VCSELs), each VCSEL comprising:

a vertical stack structure having a substantially planar top surface, including
  a top mirror,
  a bottom mirror,
  a cavity region disposed between the top mirror and the bottom mirror and including an active light generation region,
  at least one of the top mirror and the bottom mirror having a layer with a peripheral region oxidized into an electrical insulator as a result of exposure to an oxidizing agent;
wherein the vertical stack structure defines two or more etched holes each extending from the substantially planar top surface to the oxidized peripheral region, each of the etched holes being moisture passivated by an overlying moisture penetration barrier.

* * * * *